United States Patent
Ueda et al.

(10) Patent No.: US 7,498,074 B2
(45) Date of Patent: Mar. 3, 2009

(54) METAL PHOTOETCHING PRODUCT AND PRODUCTION METHOD THEREOF

(75) Inventors: Ryuji Ueda, Kitakatsushika-gun (JP); Satoshi Tanaka, Kuki (JP); Osamu Koga, Kasukabe (JP); Fusao Takagi, Kitakatsushika-gun (JP); Hiroshi Matsuzawa, Tokyo (JP); Yusuke Onoda, Minamisaitama-gun (JP); Shingo Akao, Kitakatsushika-gun (JP)

(73) Assignee: Toppan Printing Co., Ltd., Tokyo (JP)

( * ) Notice: Subject to any disclaimer, the term of this patent is extended or adjusted under 35 U.S.C. 154(b) by 305 days.

(21) Appl. No.: 10/541,904

(22) PCT Filed: Jan. 16, 2004

(86) PCT No.: PCT/JP2004/000296

§ 371 (c)(1),
(2), (4) Date: Jul. 12, 2005

(87) PCT Pub. No.: WO2004/065660

PCT Pub. Date: Aug. 5, 2004

(65) Prior Publication Data
US 2006/0127690 A1    Jun. 15, 2006

(30) Foreign Application Priority Data

Jan. 17, 2003  (JP) .............................. 2003-009237

(51) Int. Cl.
*C23F 1/02*   (2006.01)
(52) U.S. Cl. ....................................................... 428/131
(58) Field of Classification Search ................... 428/209
See application file for complete search history.

(56) References Cited

U.S. PATENT DOCUMENTS 5,509,553 A   4/1996   Hunter, Jr. et al.
5,624,781 A   4/1997   Naruse et al.

FOREIGN PATENT DOCUMENTS

| JP | 53-77848    | 7/1978  |
| JP | 58-015537   | 1/1983  |
| JP | 62-037713   | 8/1987  |
| JP | 01-188700   | 7/1989  |
| JP | 4-99185     | 3/1992  |
| JP | 2000-345373 | 12/2000 |

OTHER PUBLICATIONS

Office Action issued in counterpart Taiwanese Patent Application No. 093101110, on Jun. 26, 2007.

*Primary Examiner*—Cathy Lam

(57) ABSTRACT

A metal photoetching product comprising at least one large cavity of minor axis $W_1S$, major axis $W_1L$ and depth D1 in a surface of the product, wherein one or more cavities are included inside at least one of the at least one large cavity, and a smallest hole among the cavities has minor axis of $W_2S$, major axis $W_2L$, and depth D2; and the product satisfies the following dimensions, D1+D2=plate thickness D, 0.02 mm$\leq$D$\leq$2 mm, $0.4 \times D < W_1S < D$, and $0.2 \times D < W_2S < 0.8 \times D$.

3 Claims, 12 Drawing Sheets

METAL PHOTOETCHING PRODUCT AND PRODUCTION METHOD THEREOF

TECHNICAL FIELD

The present invention relates to a metal photoetching product and a production method thereof. Furthermore, the present application is based on Japanese Patent Application No. 2003-009237, the content of which is incorporated herein by reference.

BACKGROUND ART

A method such as described below is normally adopted for the formation of wet etching components. An alkaline-soluble photoresist film is formed to a desired pattern on an iron-based or copper-based metal material, followed by etching a metal portion which is not covered with the aforementioned photoresist using an acidic ferric chloride etching solution or cupric chloride etching solution. In wet etching methods that use an etching solution such as described above, etching proceeds isotropicly from the holes of the photoresist to directly beneath the photoresist film. Consequently, side etching (in which etching occurs directly beneath the photoresist as a result of etching penetrating isotropicly below the photoresist film as well) occurs, which causes difficulty in microprocessing. In addition, the cross-sectional shape of etched processed portions becomes roughly semi-elliptical due to the progression of the aforementioned isotropic etching. For reasons as those described above, even if it is desired to give a high aspect ratio to the etched portions of metal etching products and decrease the pitch between adjacent patterns, problems occurred such that desired ratio and patterns can not be achieved.

An example of a method proposed to solve these problems is described in Japanese Unexamined Patent Application, First Publication No. Hei 1-188700. In this method, after protecting the sides of a primary etched (it may be called as "half-etched") portion with an insulating protective film, electrolytic etching is conducted again. As a result, the unnecessary portions of the layer subjected to primary etching is removed, and a high-density pattern is formed.

In the aforementioned document, an insulating protective film is formed over the entire surface of a primary etched portion (hole portions), after which the bottom corresponding to the deep portion of the insulating protective film of the primary etched portion is dissolved simply by spraying with an acidic solution. Consequently, if variations occur in the flow of spray of the acidic solution within the surface of the metal plate, dimensional variations occur easily in the protective film within the primary etched portion. This results in a very serious problem particularly in the case of formation of high-definition patterns having a narrow pitch between adjacent patterns. In addition, in the case of high-definition patterns, since the amount of side etching is small and overhangs (overhanging portions formed at the corners of the surface and etched portion) formed by primary etching are minute, the problem occurs in which the insulating protective film is completely removed. In addition, in the case of forming a pattern which provides a large amount of etching in the vertical direction and the deep holes are formed by primary etching, removal of only deep bottom portion of the insulating protective film cannot be achieved by the aforementioned method. As a result, contrary to what is desired, etching proceeds over the entire surface during second etching.

In addition, a method is also adopted like that described in Japanese Examined Patent Application, Second Publication No. S 58-15537. In this method, the overhang of a photoresist formed by primary etching is used as a photomask, and a positive photoresist coated again on the primary etched surface is exposed and developed. The unnecessary portion of the layer subjected to etching is removed, and the positive photoresist remains on the sidewall formed by primary etching, resulting in the formation of a high-density pattern.

In the aforementioned method, if chipping or running occurs even in a portion of the photoresist overhang formed by primary etching, that deformation ends up being transferred to the shape of the resist of the second etching. Accordingly, a sharp shape is unable to be obtained, thus making this unsuitable for forming a fine pattern. This presents a serious problem particularly in the case of formation of high-definition patterns having a narrow pitch between adjacent patterns. In addition, in this method, it is difficult to uniformly coat the second photoresist in the holes formed by primary etching. Thus this method is particularly unable to accommodate to formation of high-definition patterns and patterns having a large amount of etching in which deep holes are formed by primary etching.

Moreover, an other example of a method that attempts to solve the aforementioned problems is described in Japanese Examined Patent Application, Second Publication No. S 62-37713. In this method, after filling a low molecular weight solvent-based adhesive into a surface formed by primary etching, the adhesive is allowed to dry. As a result, the overhangs of the softened resist are forcibly adhered to the primary etched surface, and the unnecessary portion of the etched layer is removed to form a high-density pattern.

In this method, there is the problem such that the resist components of the primary etching resist is dissolved by the adhesive and sporadically remained in the bottom of the primary etched portion to cause sporadic treatment in next etching. There is also the problem of the adhesive causing swelling of the resist overhangs, and a sharp shape of the overhangs is not reproduced in the drying step. These problems cause variations in the etching dimensions in the surface. In addition, since the resist overhangs of primary etching are minute in the case of high-definition patterns, the effect of adhering the overhangs is unable to be obtained and merely the adhesive comprising adhesion liquid is completely evaporated. In addition, even when attempting to obtain holes having a high aspect ratio, since side etching can only be prevented at the overhangs, this method is incompatible with patterns having deep primary etching holes that have a large amount of etching.

As has been described above, since it is difficult to carry out second etching processing both stably and with high accuracy using technology like that described in the aforementioned patent documents, and since half-etched holes of the primary etching resist is used to form the second etching resist, it is difficult to carry out processing of a different shape than primary etching in second etching and beyond.

DISCLOSURE OF THE INVENTION

A first aspect of the present invention is a metal photoetching product comprising at least one large cavity of minor axis $W_1S$, major axis $W_1L$ and depth $D1$ in a surface of the product, wherein one or more cavities are included inside at least one of the at least one large cavity, and a smallest hole among the cavities has minor axis of $W_2S$, major axis $W_2L$, and depth $D2$; and the product satisfies the following dimensions, $D1+D2$=plate thickness $D$, $0.02$ mm$\leq D \leq 2$ mm, $0.4 \times D < W_1S < D$, and $0.2 \times D < W_2S < 0.8 \times D$.

A second aspect of the present invention is a metal photoetching product comprising at least one combination of a large cavity of minor axis $W_1S$, major axis $W_1L$ and depth D1 and a small cavity of minor axis $W_2S$, major axis $W_2L$ and depth D2 in a surface of the product; wherein the product satisfies the following dimensions, 0.02 mm$\leq$D$\leq$2 mm, 0.5×$W_1S$<D1<D, 0.5×$W_2S$<D2<D, 1.7×$W_2S$<$W_1S$<5×$W_2S$, and 0.5×D2<D1<1.5×D2.

A third aspect of the present invention is a metal photoetching product comprising at least one combination of a large cavity of minor axis $W_1s$, major axis $W_1L$ and depth D1 and a small cavity of minor axis $W_2S$, major axis $W_2L$ and depth D2 in a surface of the product; wherein the product satisfies following the dimensions, 0.02 mm$\leq$D$\leq$2 mm, 0.5×$W_1S$<D1$\leq$D, 0.5×$W_2S$<D2$\leq$D, $W_2S$<$W_1S$<2.0×$W_2S$, and 0.2×D1<$W_2S$<0.8×D1.

A fourth aspect of the present invention is a metal photoetching product comprising a processed portion having a metal pattern, wherein the processed portion includes a first side wall formed by primary etching on a surface layer side of a metal layer and at least one second side wall, which extends in a direction of thickness of the film, connects to the first side wall formed by the primary etching, and is formed by etching one or more times using an electrodeposited resist; and the metal pattern has a form comprising a cavity provided by at least second etching which has a different form than a cavity provided by the primary etching.

A fifth aspect of the present invention is a metal photoetching product comprising a processed portion having a metal pattern of a complex and three-dimensional shape, wherein the processed portion includes a first side wall formed by primary etching on a surface layer side of a metal layer and at least one second side wall, which extends in a direction of thickness of the film to the first sidewall formed by the primary etching and is formed by etching one or more times using an electrodeposited resist; and an etching factor of an opening of the metal pattern is 2.6 or more.

A sixth aspect of the present invention is a production method of a metal photoetching product comprising:

preparing a metal substrate and providing at least one photoresist layer on at least a portion of the substrate;

providing one or more openings on the photoresist layer by exposure and development;

carrying out primary etching to form one or more cavities corresponding to the openings;

providing an electrodeposition photoresist layer on the etched substrate;

providing at least one opening on the electrodeposition photoresist layer within at least one of the cavities by exposure and development; and carrying out second etching after development.

A seventh aspect of the present invention is a production method of a metal photoetching product having a complex, three-dimensional shape, comprising:

coating a photoresist onto a metal surface;

exposing and developing the photoresist using a first photomask to form holes in the photoresist so that it has an opening pattern;

carrying out primary etching of the metal;

after removing the photoresist used in primary etching, providing a coating of an electrodeposited resist over the entire surface of the metal;

positioning a second photomask having an opening pattern different from that of the first photomask to much with holes produced by the primary etching;

and then exposing the coating to a parallel light source, and developing and etching the metal to form an etched shape wherein an etching factor of the shape is 2.6 or more, and dimension of a depth of a hole thereof is larger than a dimension of it's opening.

In the aforementioned aspects of the invention, the process is not limited to being carried out until second etching, but rather may be arbitrarily carried out until a subsequent higher order stage. Namely, the providing of an electrodeposition photoresist layer, the forming of at least one opening, and the carrying out of second etching may be further repeated a plurality of times, after the aforementioned method.

The aforementioned sixth aspect may be a production method of a metal photoetching product comprising:

preparing a metal substrate to provide the at least one photoresist layer as top and bottom photoresist layers of the substrate;

providing one or more large openings on the top photoresist layer by exposure and development, while providing one or more small openings on the bottom photoresist layer corresponding to locations of the large openings;

carrying out primary etching to form cavities corresponding to the large and small openings;

providing an electrodeposition photoresist layer on the etched substrate;

providing at least one further opening on the electrodeposition photoresist layer within at least one of the cavities by exposure and development;

carrying out second etching; and repeating the immediately preceding three steps to obtain a hole that passes through the substrate from top to bottom.

In addition, the aforementioned sixth aspect may be a production method of a metal photoetching product, comprising:

preparing a metal substrate and providing the at least one photoresist layer on one side of the substrate;

providing one or more large openings and small openings in the photoresist layer by exposure and development;

carrying out primary etching to form cavities in the substrate;

providing an electrodeposition photoresist layer on the etched substrate;

providing at least one opening in the electrodeposition photoresist layer within at least one of the large cavities and the small cavities by exposure and development;

carrying out second etching; and repeating the immediately preceding three steps.

BEST MODE FOR CARRYING OUT THE INVENTION

According to the present invention, a metal etching component, and its production method, can be provided having a highly precise and finely processed shape. Namely, a metal etching component, which has a high-definition etched shape having a high aspect ratio when it is viewed cross-sectionally, can be formed. According to the present invention, it is possible to form complex, three-dimensional shapes not possible with the prior art, and particularly to form a shape in which the metal etched portion has a heteromorphic cross-section. There were problems of being unable to provide metal etching products having a cross-sectional shape of a high aspect ratio, since deep etching cannot be carried out because it is necessary to reduce the amount of side etching in order to produce fine-pitch metal etching products having a narrow pitch. However, the product of the present invention, wherein pattern can be formed using photoetching method on metal materials having a smooth surface, is able to overcome said problems.

Metal etching products of the present invention can be used as high-definition metal etching products, wherein specific examples thereof include metal wiring and shadow masks of high-density printed wiring boards, lead frames, electronic and electrical components. The superior products of the present invention can also be used in various other fields as well.

(Product)

The following provides an explanation of a product of the present invention.

Figure 12:
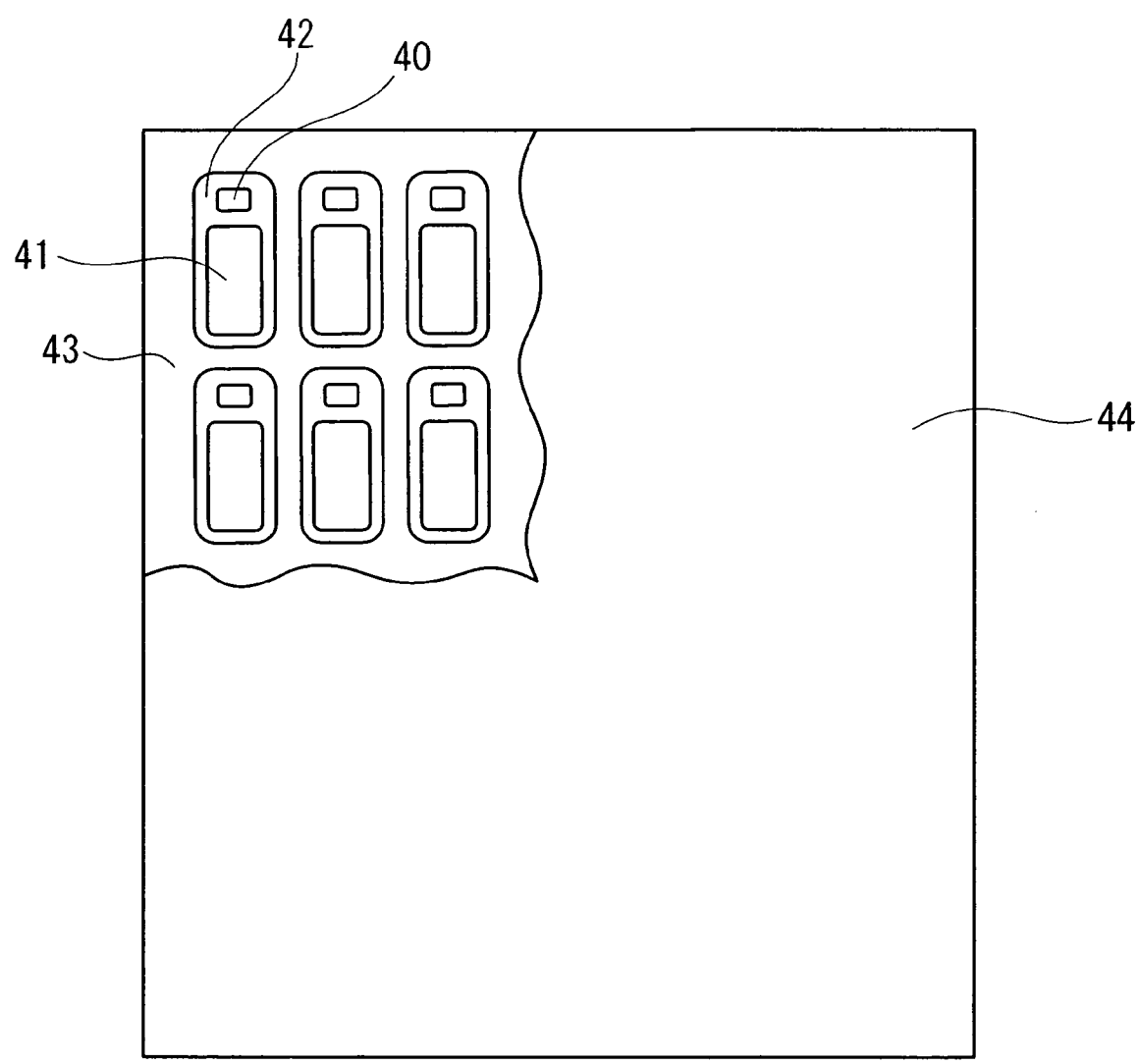
FIG. 12 is a partially enlarged top view showing an example of a product of the present invention.

A product of the present invention is a product in which has been formed a cavity (concave portion) having a high aspect ratio in the direction of film thickness (the concave portion may be a hole that does not penetrate and/or hole that does penetrate to the other side). The processed portion can be formed by higher order etching, and have a processed shape at a cavity wall of a metal layer. More specifically, the processed portion has a complex, three-dimensional metal pattern, wherein the portion has a side wall due to primary etching on the surface side of a metal layer, and at least one side wall which is formed by the use of an electrodeposited resist for the side wall, which is provided by primary etching, and at least second etching. In the present invention, a product is provided having a high aspect ratio and a heteromorphic cross-section, which was unable to be achieved in the prior art. The heteromorphic cross-section refers to the cross-section which has a complex shape instead of a simple shape in which a cavity is simply formed in an ordinary manner, when the cross-section is viewed from the side. Examples of the shape of the heteromorphic cross-section include a shape in which one or more small cavities are additionally formed within a cavity, a shape in which a large cavity and a small cavity are formed in a metal substrate at a specific ratio, and a shape in which a cavity is formed in both sides or one side of a metal substrate. As a result of having such a shape, superior characteristics can be demonstrated, such as forming a multilayer-like cross-sectional structure in a single substrate, being able to reduce the difference in hole depths between holes even if the hole diameters are considerably different, or allowing large, deep holes and extremely small diameter holes to both be present simultaneously. The superior characteristics of the present invention are not limited to these. A specific example of a product of the present invention includes a form shown in FIG. 12. In a part in which a portion of metal processing substrate 44 has been enlarged, there are a non-processed portion 42 and an extremely small large cavity 42 formed in an orderly manner and a smaller small hole 41 and even smaller small hole 40 are formed therein. A product of the present invention is not limited to this, but the present invention provides various superior metal photoetching products. In the present invention, microprocessing of large surface area is possible that is not possible by mechanical processing. In the present invention, for example, processing is possible even if the surface area of a processed portion has a value of 300×300 to 2000×2000 mm, and the pitch of the pattern of the processed portion has a minute value of 0.05 to 0.5 mm.

(Metal Plate)

A plate made of, for example, copper or copper alloy, iron, stainless steel, alloys such as iron-nickel or the like can be used for the metal plate used for producing a product of the present invention. The use of iron-nickel alloy is preferable. The thickness of the metal plate is 0.01 mm to 5 mm, preferably 0.02 mm to 2 mm, more preferably 0.05 mm to 0.5 mm and even more preferably 0.1 mm to 0.3 mm. In addition, the metal plate may be subjected to treatment such as alkaline degreasing, acid washing or chemical polishing. In addition, although the metal plate is preferably flat or has a flat surface, it may be have a curved surface. In addition, in such cases, etching may be carried out on the flat surface and/or on the curved surface.

<Product of a First Aspect of the Present Invention>

A product of a first aspect of the present invention has at least one large cavity of minor axis $W_1S$, major axis $W_1L$ and depth D1 within its surface, and has one or more small cavities within at least one of the large cavity. In the present aspect, the minor axis of the smallest hole is $W_2S$, the major axis is $W_2L$ and the depth is D2. In this product, the large cavity(s) can be arbitrarily formed in any arrangement in the metal plate. Identical large cavities which line vertically and horizontally in an orderly manner may be formed, or different large cavities may be arranged in an orderly manner. In addition, they may be arranged randomly. Small cavities can be formed at any location within the large cavity wherever possible. D1+D2=plate thickness D. Namely, a product of the present aspect is provided with holes that penetrate the metal plate due to the large cavities and small cavities.

A product of the present aspect has a dimensional relationship defined by the following formulas.

$$0.4 \times D < W_1S < D, \ 0.2 \times D < W_2S < 0.8 \times D$$

The aforementioned formulas are more preferably as follows.

$$0.4 \times D < W_1S < 0.9 \times D, \ 0.2 \times D < W_2S < 0.65 \times D$$

In addition, the aforementioned formulas are more preferably as follows.

$$0.4 \times D < W_1S < 0.8 \times D, \ 0.2 \times D < W_2S < 0.5 \times D$$

Figure 1A:
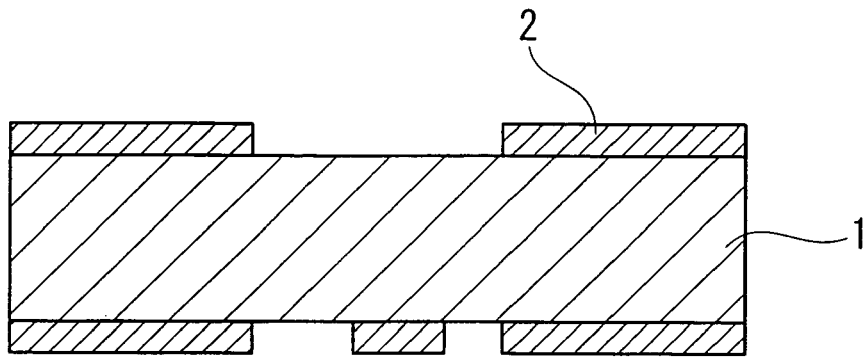
FIG. 1A is a schematic cross-sectional view showing a metal substrate having a resist layer formed into a pattern.
Figure 1B:
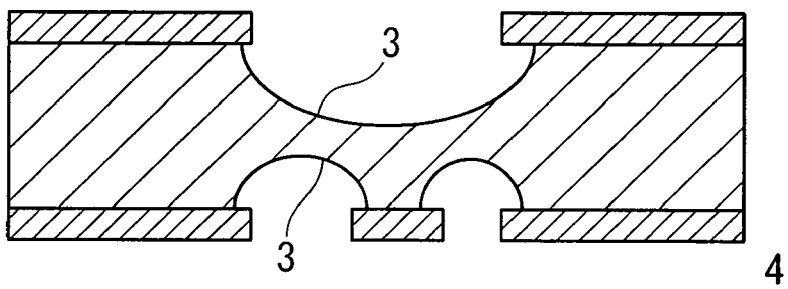
FIG. 1B is a schematic cross-sectional view showing a metal substrate on which primary etching has been carried out.
Figure 1C:
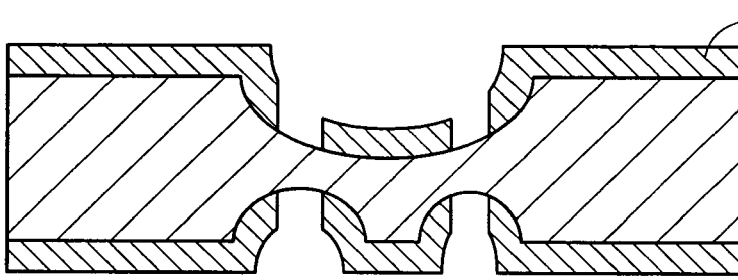
FIG. 1C is a schematic cross-sectional view showing an electrodeposited layer formed on a substrate wherein the layer has been exposed and developed, and a pattern is formed.
Figure 1D:
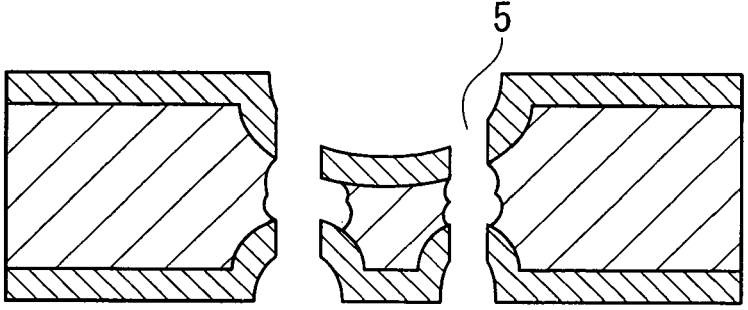
FIG. 1D is a schematic cross-sectional view showing that second etching has been carried out.
Figure 1E:
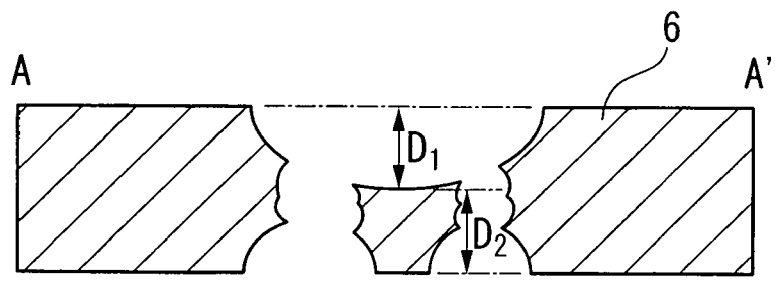
FIG. 1E is a schematic cross-sectional view showing the shape of the resulting product of the present invention.
Figure 1F:
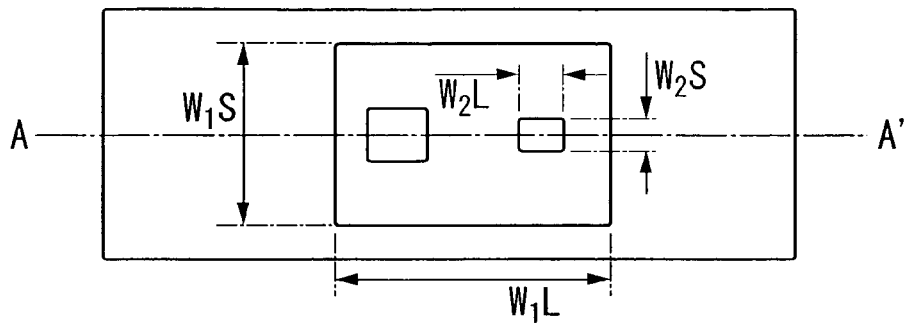
FIG. 1F is a schematic top view showing the etched portion of the product of FIG. 1E from above.

An example of the present product is shown with FIG. 1E and FIG. 1F, in which the etched portions of FIG. 1E are shown from above centering on line A-A'. (FIG. 1F is a schematic drawing, and is assumed to actually satisfy the aforementioned limitations.) In FIG. 1A, there are a base 1 made of a metal material and first resist layers 2 which are provided in both sides of the base and have respectively one and two holes resulting from exposure and development. In FIG. 1B, the state is shown in which etched portion 3 is formed by primary etching. In FIG. 1C, the state is shown in which the first resist layers 2 are removed, and desired holes are formed on etched portion 3 by exposure and development of second resist layers 4. FIG. 1D shows the state in which hole formation in the substrate progresses on the top and bottom due to second etching, and holes 5 are formed that penetrate the substrate. Furthermore, although the shapes of the large cavity and small cavities are as shown in FIG. 1, they may be formed in any arbitrary shape such as other quadrangles or other shapes, in so far as the aforementioned limitations are satisfied. In addition, although FIG. 1F only depicts a pair of etched portions, one or more pairs of etched portions can actually be formed.

<Product of a Second Aspect of the Present Invention>

A product of a second aspect of the present invention has at least one combination of a large cavity of minor axis $W_1S$, major axis $W_1L$ and depth D1, and a small cavity of minor axis $W_2S$, major axis $W_2L$ and depth D2, in a surface of the product. Furthermore, both of the aforementioned large cavity and small cavity have a bottom and do not penetrate through the metal plate. These cavities may both be present on the surface of the metal at arbitrary orientations. The large cavities and small cavities can be arbitrarily formed in any arrangement in the metal plate wherever possible. Pairs of the same large cavities and small cavities may be formed in an orderly manner, or pairs of mutually different large cavities and small cavities may be arranged in an orderly manner. In addition, they may also be arranged randomly, and may be arranged in any manner. A product of the present aspect has at least one combination of a large cavity of minor axis $W_1S$, major axis $W_1L$ and depth D1, and a small cavity of minor axis $W_2S$, major axis $W_2L$ and depth D2, in its surface, and has a dimensional relationship defined by the following formulas.

$$0.5 \times W_1S < D1 < D, \ 0.5 \times W_2S < D2 < D, \ 1.7 \times W_2S < W_1S < 5 \times W_2S, \ 0.5 \times D2 < D1 < 1.5 \times D2$$

The aforementioned relationship is preferably defined by the following formulas.

$$0.5 \times W_1S < D1 < D, \ 0.5 \times W_2S < D2 < D, \ 2.2 \times W_2S < W_1S < 5 \times W_2S, \ 0.5 \times D2 < D1 < 1.3 \times D2$$

The aforementioned relationship is more preferably defined by the following formulas.

$$0.5 \times W_1S < D1 < D,\ 0.5 \times W_2S < D2 < D,\ 2.7 \times W_2S < W_1S < 5 \times W_2S,\ 0.5 \times D2 < D1 < 1.1 \times D2$$

Figure 2A:
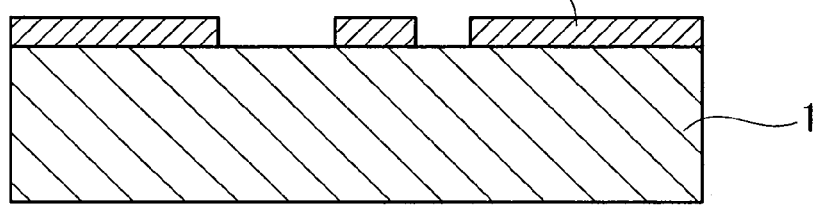
FIG. 2A is a schematic cross-sectional view showing a metal substrate having a resist layer formed into a pattern.
Figure 2B:
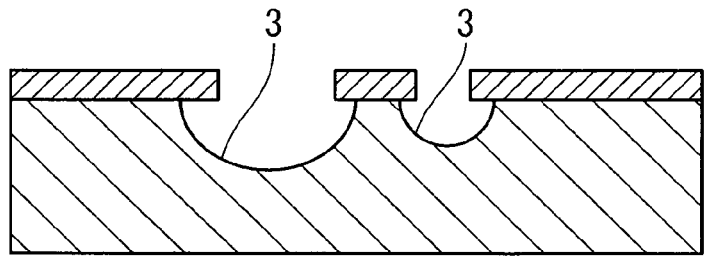
FIG. 2B is a schematic cross-sectional view showing a metal substrate on which primary etching has been carried out.
Figure 2C:
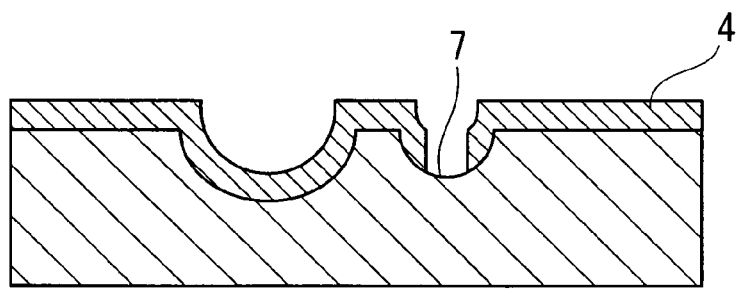
FIG. 2C is a schematic cross-sectional view showing that a selected portion of an electrodeposited resist layer within a small cavity has been exposed and developed.
Figure 2D:
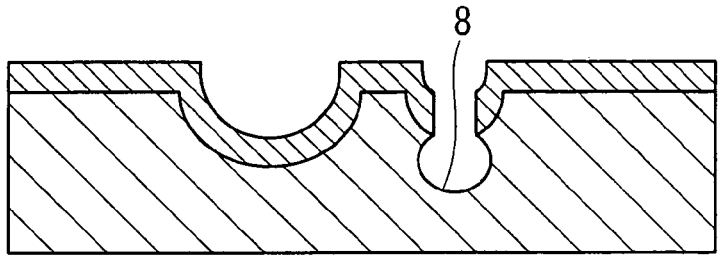
FIG. 2D is a schematic cross-sectional view showing that second etching has been carried out.
Figure 2E:
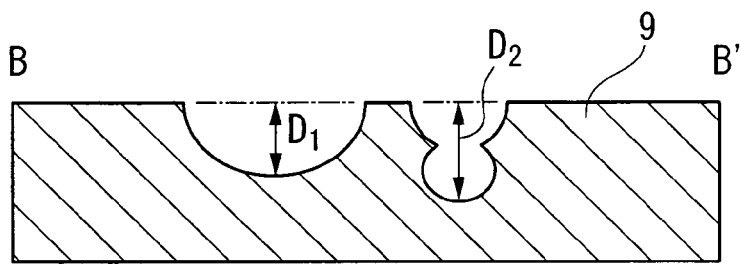
FIG. 2E is a schematic cross-sectional view showing the shape of the resulting product of the present invention.
Figure 2F:
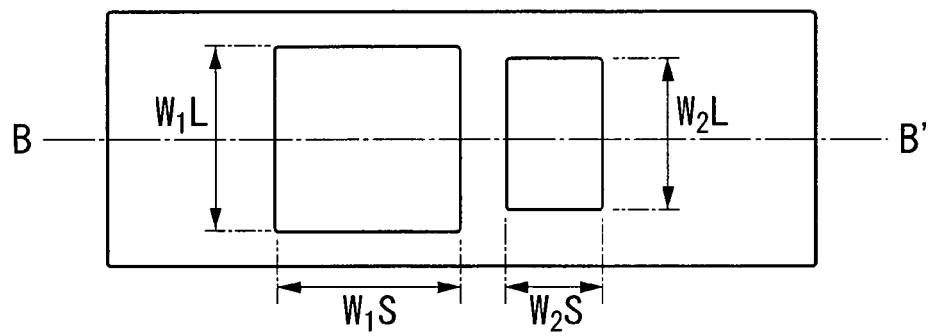
FIG. 2F is a schematic top view showing the etched portion of the product of FIG. 2E from above.

An example of the present product is shown with FIG. 2E and FIG. 2F, in which the etched portions of FIG. 2E are shown from above centering on line B-B'. (Furthermore, FIG. 2F is a schematic view, and is assumed to actually satisfy the aforementioned limitations.) In FIG. 2A, there are a base 1 made of a metal material and a first resist layer 2 provided on one side of the base, wherein two desired holes resulting from exposure and development are provided. In FIG. 2B, the state is shown in which large and small etched portions 3 are formed by primary etching. In FIG. 2C, the state is shown in which, after the first resist layer 2 is removed, a second resist layer 4 is formed, and then a desired hole 7 is subsequently formed in the small etched portion 3 by exposure and development. In FIG. 2D, an etched portion according to the hole 7 is formed by second etching. In FIG. 2E, the second resist layer 4 is removed to form an etching product. Furthermore, although the shapes of the large cavity and small cavity in FIG. 2 are quadrangular, they may be formed in any arbitrary shape such as another quadrangular shape or other shape, in so far as the aforementioned limitations are satisfied.

<Product of a Third Aspect of the Present Invention>

A product of a third aspect of the present invention has at least one combination of a large cavity of minor axis $W_1S$, major axis $W_1L$ and depth D1, and a small cavity of minor axis $W_2S$, major axis $W_2L$ and depth D2, in a surface of the product. Furthermore, the aforementioned large cavity and small cavity may or may not penetrate through the metal plate. These cavities may both be present at arbitrary orientations. The large cavities and small cavities of the present product can be arbitrarily formed in any arrangement in the metal plate wherever possible. Same pairs of the large cavities and small cavities may be formed in an orderly manner, or different pairs of large cavities and small cavities may be arranged in an orderly manner. In addition, they may also be arranged randomly. A product of the present aspect has at least one combination of a large cavity of minor axis $W_1S$, major axis $W_1L$ and depth D1, and a small cavity of minor axis $W_2S$, major axis $W_2L$ and depth D2, in its surface, and has a dimensional relationship defined by the following formulas.

$$0.5 \times W_1S < D1 \leq D,\ 0.5 \times W_2S < D2 \leq D,\ W_2S < W_1S < 2.0 \times W_2S,\ 0.2 \times D1 < W_2S < 0.8 \times D1$$

The relationship is preferably defined by the following formulas.

$$0.5 \times W_1S < D1 \leq D,\ 0.5 \times W_2S < D2 \leq D,\ W_2S < W_1S < 1.8 \times W_2S,\ 0.2 \times D1 < W_2S < 0.6 \times D1$$

The relationship is more preferably defined by the following formulas.

$$0.5 \times W_1S < D1 \leq D,\ 0.5 \times W_2S < D2 \leq D,\ W_2S < W_1S < 1.6 \times W_2S,\ 0.2 \times D1 < W_2S < 0.4 \times D1$$

Figure 3A:
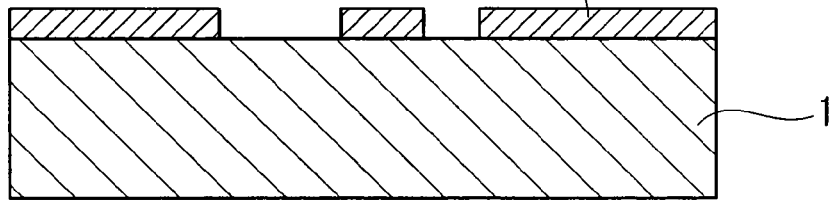
FIG. 3A is a schematic cross-sectional view showing a metal substrate having a resist layer formed into a pattern.
Figure 3B:
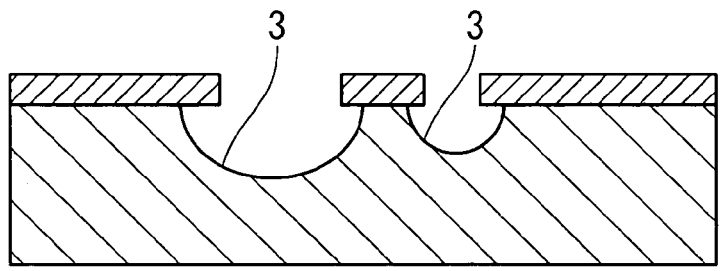
FIG. 3B is a schematic cross-sectional view showing a metal substrate on which primary etching has been carried out.
Figure 3C:
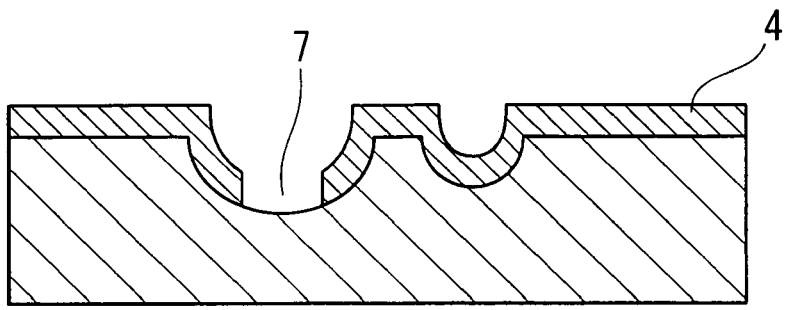
FIG. 3C is a schematic cross-sectional view showing that a selected portion of an electrodeposited resist layer within a large cavity has been exposed and developed.
Figure 3D:
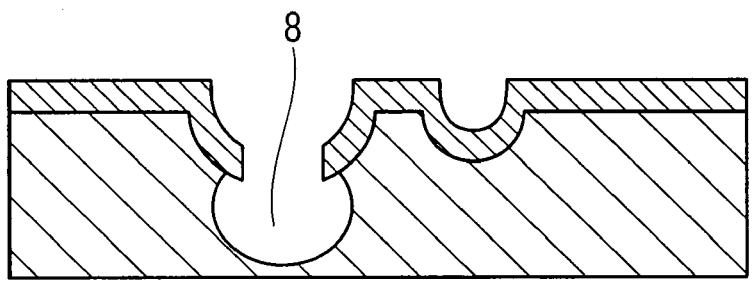
FIG. 3D is a schematic cross-sectional view showing that second etching has been carried out.
Figure 3E:
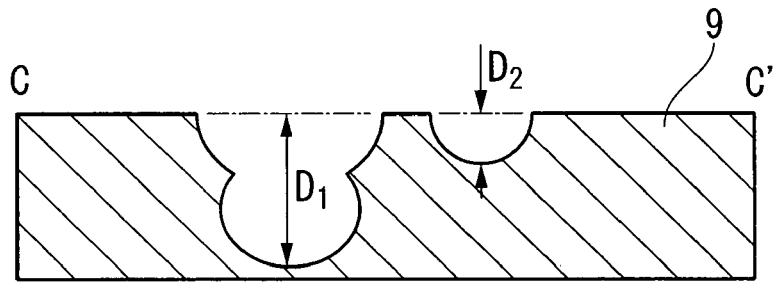
FIG. 3E is a schematic cross-sectional view showing the shape of the resulting product of the present invention.
Figure 3F:
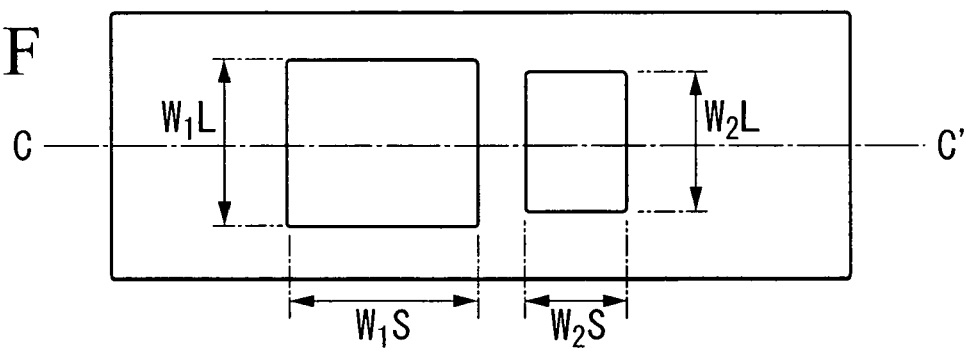
FIG. 3F is a schematic top view showing the etched portion of the product of FIG. 3E from above.

An example of the present product is shown with FIG. 3E and FIG. 3F, in which the etched portions of FIG. 3E are shown from above centering on line C-C'. (FIG. 3F is a schematic view, and is assumed to actually satisfy the aforementioned limitations.) In FIG. 3A, there are a base 1 made of a metal material and a first resist layer 2 provided in one side of the base, wherein the resist layer has two desired holes resulting from exposure and development. In FIG. 3B, the state is shown in which two etched portions 3 are formed by primary etching. In FIG. 3C, the state is shown in which, after the first resist layer 2 is removed, a second resist layer 4 is formed, and then a desired hole 7 is formed in the larger etched portion 3 by exposure and development. In FIG. 3D, an etched portion originating in hole 7 is formed by second etching. In FIG. 3E, second resist layer 4 is removed to form an etching product. Furthermore, although the shapes of the large cavity and small cavity in FIG. 3 are quadrangular, they may be formed in any arbitrary shape such as another quadrangular shape or other shape in so far as the aforementioned limitations are satisfied.

<Other Characteristics of Products of the Present Invention>

In a metal etching product of the present invention, in the case that a metal pattern includes a side wall wherein the wall is provided on a surface side of a metal layer and the wall is formed by primary etching of a hole in a coating, and a side wall wherein the wall is provided on the deep side of the metal layer apart from the surface of the metal layer and the wall is formed by second etching using an electrodeposition photoresist, the etching factor of at least one of resultant hole (cavity) included in said metal pattern is preferably 2.6 or more. Superior characteristics can be provided by having a etched shape such that a hole depth is larger relative to hole opening size. In experiments conducted by the inventors of the present invention, in the case of a photoresist pattern having a photoresist hole diameter of 10 μm or more, since side etching proceeds directly below the photoresist in the case of primary etching only, the etching factor was a maximum of less than about 2.6. However, in an example of a product of the present invention, an etching factor of 6.9 can be achieved when second etching using an electrodeposition photoresist is conducted to a pattern which has a hole diameter of 260 μm and is formed by using a primary photoresist.

The following provides an explanation of etching factor (EF). Etching factor (EF) is defined as shown in Equation 1 with the dimension of the etched depth (ED) and the amount of side etching (SE), which is equal to half of the difference between the dimension (minor axis) of the hole of the metal layer subjected to primary etching in the primary etching step and the dimension of the hole of the photoresist used for primary etching, which is corresponding to said hole of the metal layer.

$$EF = ED/SE$$

Furthermore, in the case additional etching is further carried out after second etching, the calculation may be conducted by using the values obtained after the highest order of etching as the etching dimensions.

Figure 11:
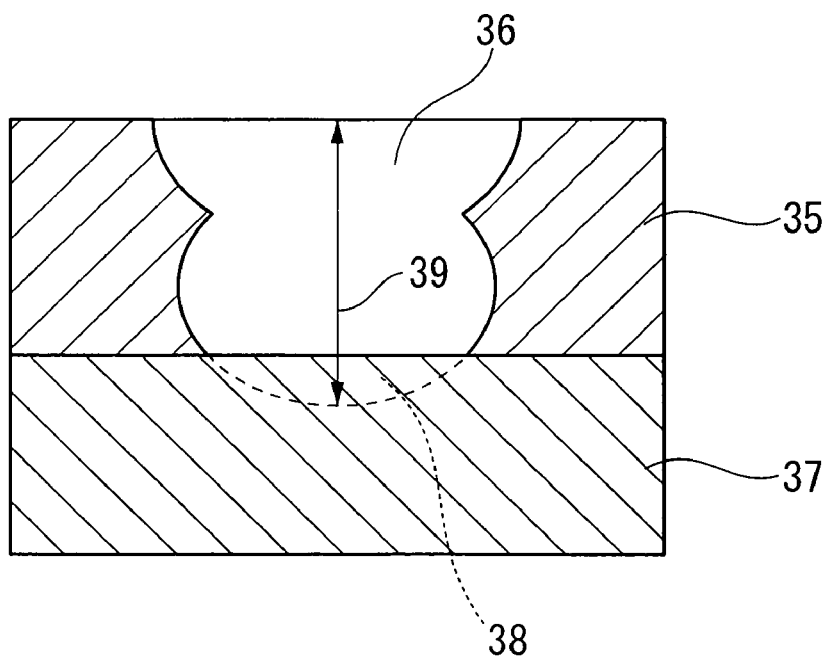
FIG. 11 is a schematic cross-sectional view showing a product in which a hole has been provided in a second etching step in a metal layer laminated onto an insulating substrate.

A product of the present invention may also have a metal layer provided on an insulating substrate as shown in FIG. 11. The following is considered in the case the cavity penetrates through the metal layer as shown in the figure. FIG. 11 is a partial explanatory drawing showing a cross-section of a metal etching product, in which a hole 36, which is provided by a second etching step in a metal layer 35 presented on an insulating substrate 37.

The ED and SE of hole 36 of metal layer 35 which is subjected to second etching or high stage etchings can be obtained by measurement of values of the cross-section which is the cutting plane provided by cutting vertically through the center of hole 36. As shown in the drawing, when the bottom shape 38 of the deep position of hole 36 of metal layer 35 does not have a curved shape and a port of the bottom shape is lost, as in the case of providing hole 36 extending to insulating substrate 37 or providing a through hole in metal layer 35, a value can be obtained by extrapolating the curved shape of the bottom, namely by estimating ED.

In this manner, in the present invention, a nearly vertical through hole may be produced by etching from both sides of a metal substrate, or a metal wiring pattern having a high aspect ratio may be formed by etching from one side of a metal foil in which a metal substrate has been adhered to a non-etched substrate.

(Production Method)

The following provides a detailed explanation of the production method of the present invention.

In a production method of a metal etching product having a complex, three-dimensional shape of the present invention, a three-dimensional, complex etched shape can be obtained by changing the pattern of the first photomask and the pattern of the photomask(s) used in subsequent exposure step(s). In addition, by employing photomasks having different patterns, which are provided on the top and bottom side for a single exposure step, more complex, three-dimensional shapes can be obtained such that metal plate thickness varies partially.

A product of the present invention as described above can be obtained by going through a second or more high stage etching step(s) using an electrodeposited resist in order to obtain a desired complex shape. By carrying out highly anisotropic etching in the vertical direction, a through hole having a high aspect ratio can be formed, and a high-definitional and high aspect ratio metal pattern can be formed.

In order to obtain a product of the present invention, etching is at least carried out n times (where n represents multiple times of 2 or more), namely a plurality of times. Etching is preferably carried out three times or less from the viewpoint of production costs. The steps for second etching described below can be repeated a plurality of times under the same conditions or while changing the conditions. It is preferable that the etching conditions be changed at least once. The photomasks that can be used in the nth time of etching and n+1 time of etching, wherein the etchings are carried out continuously at a predetermined portion, may be the same or different. It is preferable that the photomask used for the n+1th time of etching is selected such that the exposed portion resulting from the mask used in the n+1th time be smaller than that of the nth time of etching. First, a photoresist is coated onto at least one side or one portion of the surface of a metal substrate to form a resist film. Subsequently, a hole pattern is formed. Namely, as a result of carrying out exposure at a desired area of the resist film and development, the resist film at the area is removed. Namely, the metal surface can be exposed by forming holes in the resist in the hole pattern. Subsequently, primary etching is carried out, and a cavity having a side wall is provided in the metal surface. A step in which the resist film is removed may be subsequently included. Next, a electrode position photoresist pattern, in which opening is provided only at the bottom of the deep position, is formed. Namely, the formation of the second resist film is carried out by electrodeposition on the metal substrate in which the cavity has been formed, and then exposure and development are carried out at a desired location. The conditions and/or shape of the exposure and development are preferably different from those of the previous exposure and development. Subsequently, second etching is carried out. As a result, a cavity is again formed within the aforementioned cavity. The aspect ratio increases by repeating etching of only the bottom of deep position of a cavity in this manner.

(Production Example of Cavity)

The following processes are examples of a production method of a metal etching product having a complex, three-dimensional shape. These include a method in which a large cavity is formed in a substrate by at least one time of etching, and then at least one of small cavity is formed inside the large cavity by at least one time of etching, a method in which a small cavity is formed in a substrate by two or more times of etching and a large cavity is formed in the substrate by one time of etching, or its reverse method, and a method in which a large cavity is formed from one side of a substrate by at least one time of etching, and a small cavity is formed from the opposite side of the substrate by at least one time of etching to form a through portion. A product can be produced so that both a through portion and a cavity portion are present in the substrate.

In the aforementioned methods, a photoresist is coated onto a metal surface, and exposure and development are carried out using a mask and the like to form a pattern, in which a hole is formed, followed by primary etching. In the subsequent step(s) starting with second etching, a holed electrodeposition photoresist pattern can be formed at a desired location which may be different from the pattern of primary etching. Namely, a complex etching processed shape can be formed by repeating electrodeposited film formation, exposure at a desired location and development, and etching. In addition, in the case of forming a pattern by photolithography on a smooth surface of a metal material, a resist pattern having a thickness of about 10 μm can be formed using a photomask formed to a desired pattern.

(Type of First Photoresist and Method for Providing Resist)

A photoresist is provided to at least one portion or at least one side of the substrate prior to primary etching. A naphthoquinone azide-based or Novolak resin-based positive photoresist, or negative photoresists such as those of dichromic acid-based, polyvinyl cinnamate-based or cyclized rubber azide-based can be used for the resist used in the primary etching step. In addition, a positive or negative electrodeposition photoresist may be used for the primary etching. The thickness of the resist is 3 μm to 30 μm, and preferably 5 μm to 20 μm, from the viewpoint of etching resistance and resolution. In the case of coating a liquid photoresist, a normally used photoresist coating method which uses as spin coater, roll coater dip coater or the like can be used. A laminator is used in the case of using a dry film resist. A printing resist may be printed in a pattern. Among these, the aforementioned use of a photoresist is preferable from the viewpoint of microprocessing.

(Exposure and Development Carried Out Prior to Primary Etching)

Exposure at a desired location and development are carried out on the photoresist prior to primary etching. The first photomask can be used for exposure, and when development is subsequently carried out, a desired resist pattern is obtained. Since a photoresist is coated on the metal surface, a photoresist wherein the hole pattern is formed is obtained by exposure and development. Exposure may be carried out once or a plurality of times.

Examples of exposure methods and conditions include a parallel light source, diffused light source, contact exposure and projection exposure. Examples of development methods and conditions include spray-development and dipping development. Although the conditions for exposure and development can be selected arbitrarily, a parallel light source is preferable for exposure, and spraying is preferable for development, from the viewpoint of microprocessing.

(Primary Etching)

Primary etching is carried out after obtaining the resist pattern. The primary etched shape (half-etched shape) is formed by this step. Examples of etching agents include ferric chloride solution and cupric chloride solution. Any arbitrary method may be used to supply the etching agent, examples of which include spraying, paddle method, dipping and jetting, with spraying being preferable.

(Removal of First Photoresist)

Prior to forming a following photoresist, the photoresist adhered to the metal material and used in the primary etching step can be removed. The removal method and conditions are arbitrary. The photoresist may be removed using a resist removal solution such as a hot alkaline solution, organic solvent or mixture thereof. In addition, examples of removal methods include spraying method and dipping method, and the spraying method using an alkaline solution is preferable.

(Resist Formation after Primary Etching)

A second resist is formed by electrodeposition on the metal substrate on which primary etching has been carried out. When the second resist or more higher stage resist is provided, it is nearly impossible to obtain a coating having an uniform film thickness of the resist by using a liquid photoresist or dry film resist such, since the coating is provided on a metal layer having an etching surface having irregularities. If a liquid photoresist is used, the liquid photoresist easily accumulates in the primary etched hole when the photoresist used in second etching is coated onto the surface having the cavity formed by primary etching. Accordingly, the problem results in which it is impossible to form a photoresist of uniform film thickness. In addition, the use of a dry film resist has the problem of being unable to effectively adhere the dry film resist to the primary etched surface (particularly to the cavity).

Thus, electrodeposition can be used in the invention. Coating of an electrodeposition photoresist, which has uniform thickness, is provided by electrodeposition method onto the metal surface in which irregularities have formed due to primary etching. The coating of the electrodeposited resist may be provided on the entire-surface of the substrate, or only specific surface(s) or portion(s) thereof. The film thickness of the electrodeposition photoresist is about 20 μm or less, and preferably about 8 μm. Film thickness can be controlled by the dielectric constant of the material itself and the electrodeposition conditions. However, film thickness of 2 μm or more is preferable in consideration of problems regarding the mechanical strength of the overhang formed by side etching, while a film thickness of 10 μm or less is preferable for forming a high-definition pattern.

Here, a positive electrodeposition photoresist is preferable for the material of the electrodeposition photoresist used in second etching. Although this does not mean that a negative electrodeposition photoresist cannot be used, it tends to result in disadvantages like those indicated below.

Figure 8:
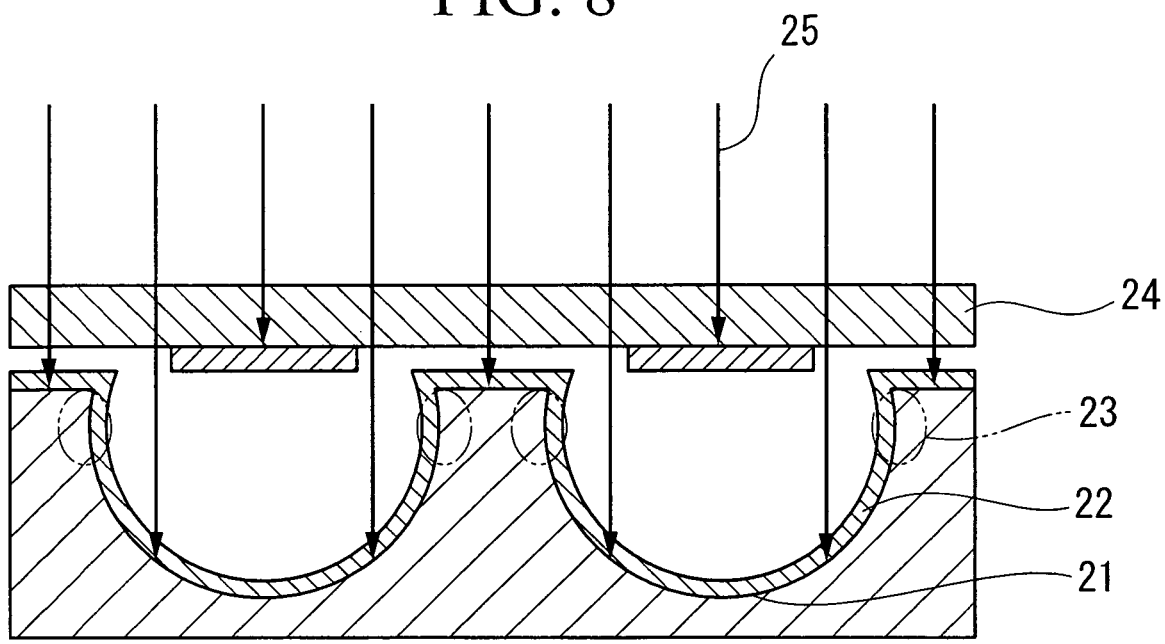
FIG. 8 is a schematic top view showing etching when a negative electrodeposition photoresist has been used.

FIG. 8 is a partial explanatory drawing showing a cross-section of a metal material in an etching step when a negative electrodeposition photoresist is used. The surface portion of the half-etched holes wherein an inverted tapered shape is provided by the primary etching is shown. In FIG. 8, coating of a negative electrodeposition photoresist 22 is provided on a metal material 21 having a half-etched shape formed in the primary etching step. Negative type photomask 24 is provided on the surface of metal material 21, and light 25 is irradiated from above negative photomask 24. Light is obstructed by the mask in the center of the hole. Here, since the surface portion of the hole has an inverted tapered shape as a result of primary etching, there are portions 23, which cannot be exposed, in the negative electrodeposited resist. As shown in the drawing, if the amount of primary etching is large and the surface side portion of the half-etched surface has an inverted tapered shape (resist portion 23), in the case of having used a negative photoresist for the second photoresist, a position, which is required to be exposed, of the surface side portion of the half-etched surface is unable to be exposed. Accordingly, it is preferable to use a positive electrodeposition photoresist.

(Second Exposure and Development)

Next, exposure and development are carried out on the electrodeposition photoresist. A second photomask that differs from the first photomask can be used for exposure. As a result of the aforementioned treatment, the metal surface can be exposed only at a desired position of the half-etched wall provided by the primary etching step. A second photomask having a pattern that differs from the first photomask is preferably used for the mask. In addition, in the case a positive electrodeposited resist is used, the size of openings to be exposed of the second photomask is preferably smaller than that of the first photomask. Exposure is preferably carried out after positioning the second photomask, which has a pattern that differs from the first photomask, with the primary etched hole produced in the previous etching step. Although exposure is preferably carried out using a parallel light source from above, exposure is not limited to this depending on the conditions. When a second photomask is used, proximity exposure, soft contact or projection exposure method may be used. In this case, exposure and development can be carried out with a parallel ultraviolet light source after aligning with the primary etched hole or convex portion in the previous etching step.

Furthermore, a pattern shape that differs from the first photomask can also be used for the photomask of a higher stage of etching beyond second etching. A photomask having a different hole pattern than the photomask used in the immediately preceding etching can be used, and positioning of the photomask with the previously etched hole or cavity can be carried out followed by exposure and development. The aforementioned steps can be repeated multiple times such that second stage, third stage and subsequent stages of processing are conducted. In this case, exposure can be carried out by selecting mutually different photomasks so as to be able to form a desired pattern. When a positive electrodeposited resist is used, it is preferable that masks are selected such that the holes become smaller and the exposed portion becomes smaller the higher an order of etching. Namely, it is preferable that the openings provided by exposure become smaller the higher the order of etching. As a result of these methods, a processed shape can be formed accurately at a desired location. In second etching, the photomask may be aligned with the cavity formed by primary etching followed by exposure with a parallel light source and development. Since different hole shape of electrodeposition resist can be provided per each stage and etching can be carried out according to the hole shape, it is possible to faithfully reproduce an electrodeposition photoresist pattern according to the pattern shapes of the photomasks used in high stages, and the shape of the resist edge can be made to be clear to allow the obtaining of a metal edge having a clear etched shape.

(Second Etching)

Second etching is carried out after the aforementioned development. In and after the second etching step, etching can be carried out at a desired location, and a complex, high-definition metal pattern processed shape can be formed while preventing side etching of the metal material surface, due to conducting an electrodeposition step. Second etching may be carried out in the same manner or in a different manner from the primary etching step. For example, etching may be carried out by spraying an etching solution such as a ferric chloride solution or cupric chloride solution as in primary etching. As a result, a metal etching product is obtained that has a complex, three-dimensional shape.

In the present invention, the process is not limited to a process conducting until second etching, but two or more etching steps can also be carried out. For example, by further conducting third, fourth and fifth etching steps, an etching product can be obtained that has a higher aspect ratio. In the n+1th etching step, side etching of the hole or cavity of the previous nth etching is prevented. Namely, the side portions of the processed portion are protected with electrodeposition photoresist and etching proceeds only at a desired portion of the processed portion.

Furthermore, etching can be carried out on only one side or on both sides of a metal plate. In addition, in the case of carrying out etching on both sides, the number of etching steps may be changed between the top and bottom surfaces of the plate. In this manner, the number, the order and the locations of exposure, development and etching are arbitrary, and as a result, various superior products can be obtained.

(Removal of Electrodeposition Photoresist)

The electrodeposition photoresist may be removed following the aforementioned etching. At this time, although a hot alkaline solution, organic solvent or the like is used to remove the electrodeposition photoresist, the use a 3% by weight aqueous solution of sodium hydroxide is preferable. In addition, although the removal temperature is selected arbitrary, a high temperature is preferable from the viewpoint of removal speed, and in the case of using a 3% by weight aqueous solution of sodium hydroxide, removal is preferably carried out at about 60° C. In this manner, a metal photoetching product can be completed that has a complex etched shape.

<Rounded Corners of Etching>

Figure 9A:
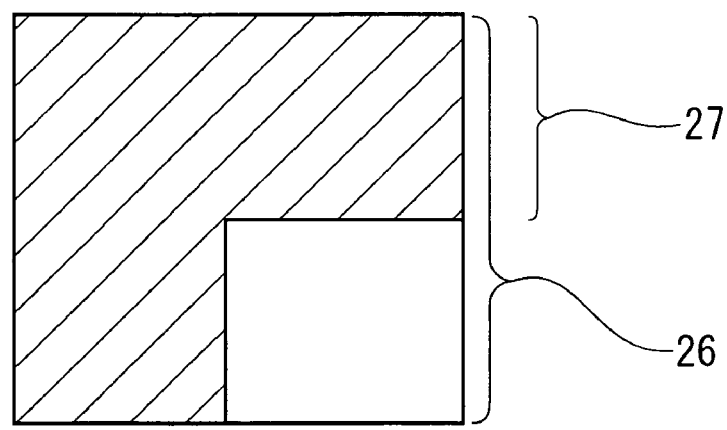
FIG. 9A is a schematic top view showing the shape of a patterned surface of a primary positive photoresist.
Figure 9B:
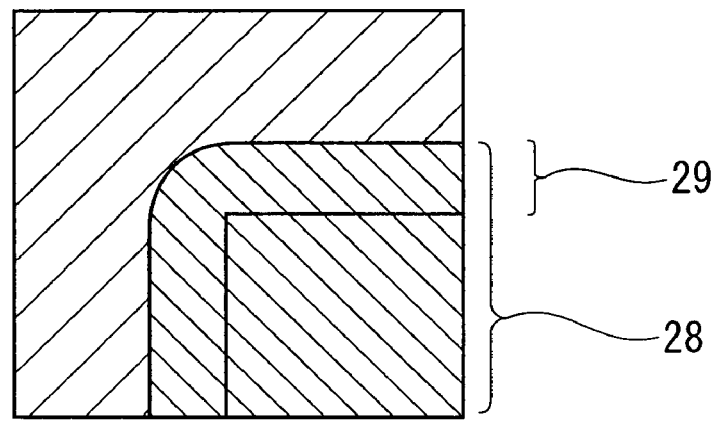
FIG. 9B is a schematic top view showing the shape of the surface in a primary etching step.
Figure 9C:
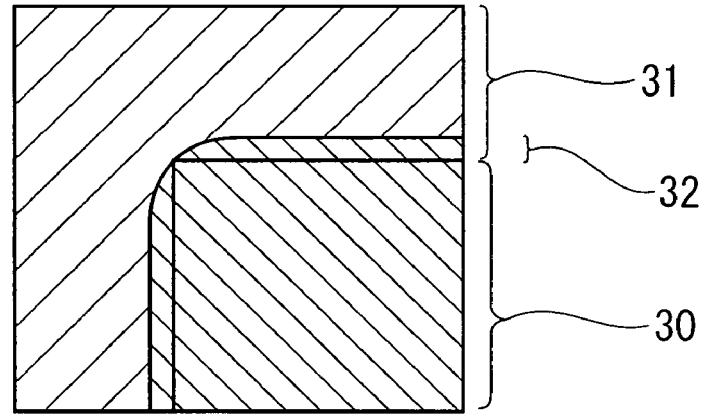
FIG. 9C is a schematic top view showing the shape of a patterned surface of a second positive electrodeposition photoresist.
Figure 9D:
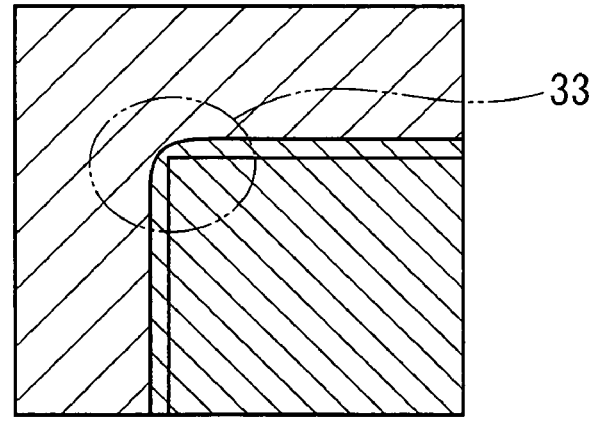
FIG. 9D is a schematic top view showing the shape of the surface in a second etching step.

In the case the resist pattern has rectangular, an effect due to side etching is provided on the corners. As shown in FIG. 9A, a positive photoresist pattern 27 for primary etching having a rectangular corner is formed on metal material substrate 26, and when primary etching is carried out, in addition to primary etched cavity 28 formed in the primary etching step, a side-etched portion 29 of the cavity formed in the primary etching step is formed as shown in FIG. 9B. Namely, the etched shape ends up being a rectangular having a rounded corner (corner depicted by a curve instead of right angle) having radius SE wherein center thereof is on the rectangular corner of the aforementioned photoresist. In order to reduce the degree of rounding, a photomask having enhanced corners is used for the electrodeposition photoresist of the second etching and/or etching of more high stage. FIG. 9C shows a metal material exposed portion 30 which is used for second etching and is formed by using the aforementioned photomask, a positive electrodeposition photoresist coating section 31, and a positive electrodeposition photoresist coating portion 32 wherein the photoresist coating of the portion is provided on the primary etched cavity formed in the primary etching step. The electrodeposited resist is deposited to the line starting in the center of the rounded corner of radius SE and running parallel to the side of side etched portion 29. A higher aspect ratio is obtained by also arbitrarily provided a positive electrodeposition photoresist at a desired portion of the rounded corner. FIG. 9D shows a site 33 where rounding of the rectangle has been reduced by a second etching step. In this manner, by controlling the etched shape, a metal etching product which has a deep-hole etched shape relative to the hole opening dimensions and the etching factor thereof is 2.6 or more can be produced.

(Other)

When one side etching is conducted and a plate thickness is 0.01 to 5 mm, the lower limit of the etched hole diameter is roughly 200% of the plate thickness in general. However, according to the method of the present invention, a hole can be etched at 40 to 160%, preferably 40 to 130%, and more preferably 40 to 100%, of the plate thickness. Such a hole is possible. In addition, when etching is conducted on both sides of a plate and a plate thickness is 0.05 to 10 mm, the limit of the etched hole diameter is roughly 100% of the plate thickness in general. However, according to the present invention, a hole can be etched at 20 to 80%, preferably 20 to 65%, and more preferably 20 to 50%, of the plate thickness. Moreover, according to the present invention, the etched cross-sectional shape can include a tapered shape and/or shape containing different levels (step-wise shape) by determining a degree of amendments and design for an original plate of the second etching step and steps thereafter, thereby enabling not only control of the shape of a simple vertical cross-section, but also three-dimensional control of the etched shape.

EXAMPLES

The following Examples 1, 2 and 3 based on the claims indicate processes for producing etched processed shapes having complex, three-dimensional shapes.

Comparative Example 1 indicates etching of a metal substrate in accordance with conventional single-step etching. As can be understood from a comparison with Comparative Example 1 and Example 1, the cross-sectional shape of the etched processed portion is semi-elliptical.

Example 1

Figure 4A:
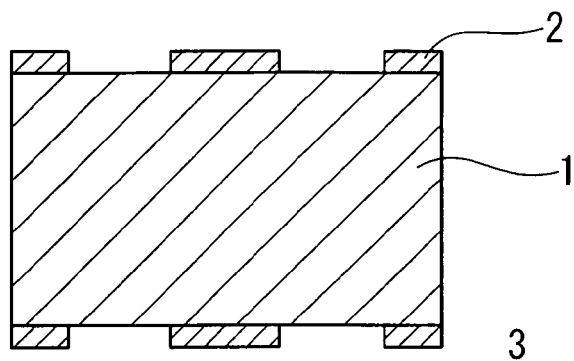
FIG. 4A is a schematic cross-sectional view showing a metal substrate having a resist layer formed into a pattern.

FIGS. 4A to 4E are schematic explanatory cross-sectional views showing the steps of a production method of the present Example 1. An iron-based metal material substrate 1 having a thickness of 500 μm was alkaline-degreased and coated with a positive photoresist (PMER P-RH300PM, Tokyo Ohka Kogyo Co., Ltd.) to a film thickness of 10 μm. Next, the substrate was exposed to ultraviolet light through a first photomask having a slot pattern, which has holes of 260 μm×860 μm and a pitch of 350 μm×1000 μm. Next, the pattern of positive photoresist 2, which has same dimensions as the first photomask and is used for a primary etching step, was formed by spray-developing with an aqueous alkaline solution (FIG. 4A).

Figure 4B:
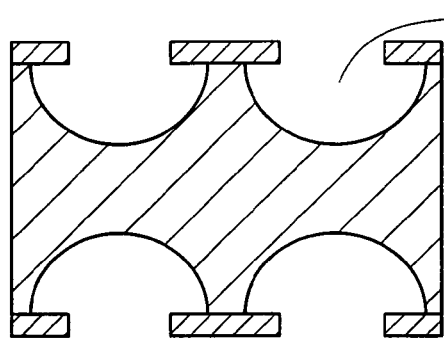
FIG. 4B is a schematic cross-sectional view showing a metal substrate on which primary etching has been carried out.

The primary etching step was conducted such that a ferric chloride etching solution was sprayed at 50° C. and 0.3 MPa until the side etching progressed to 20 μm, and half-etched portion 3 was formed following primary etching (FIG. 4B). Subsequently, after washing with water, the substrate was immersed in a 3% by weight aqueous solution of sodium hydroxide at 60° C. to remove the positive photoresist.

Figure 4C:
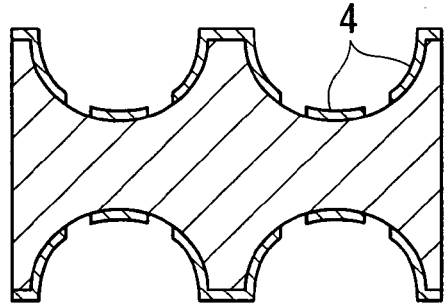
FIG. 4C is a schematic cross-sectional view showing that a selected portion of an electrodeposited resist layer has been exposed and developed.

Next, coating of positive electrodeposition photoresist 4 (Sonne EDUV P-500, Kansai Paint Co., Ltd.) having a film thickness of 8 μm is provided thereto. Then, a slot pattern which has holes of 260 μm×860 μm and a pitch of 350 μm×1000 μm was provided to the coating, followed by exposing through a second photomask having a rectangular shade portion of 180 μm×780 μm within a spot pattern. Exposure was carried out at 150 mJ/cm$^2$, and after heat treating at 140° C. for 15 minutes, the substrate was spray-developed with a 1% by weight aqueous solution of sodium hydroxide at 35° C. (FIG. 4C).

Figure 4D:
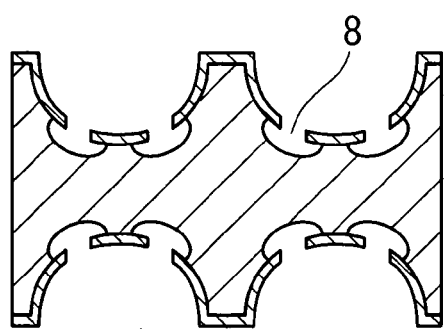
FIG. 4D is a schematic cross-sectional view showing that second etching has been carried out.
Figure 4E:
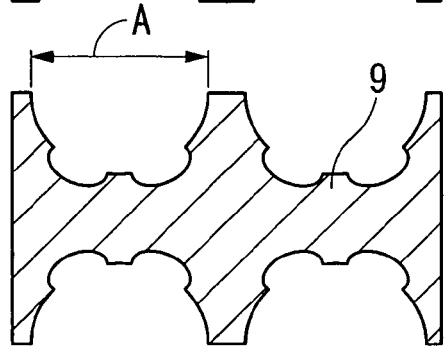
FIG. 4E is a schematic cross-sectional view showing the shape of the resulting product of the present invention.

Moreover, the second etching step was conducted such that a ferric chloride etching solution was sprayed at 50° C. and 0.3 MPa to obtain etched portion 8 (FIG. 4D). Subsequently, the resist was removed to produce a three-dimensional shape in which the dimensions of opening A in a surface of the metal having a plate thickness of 500 µm were 300 µm×900 µm, and the dimensions of a processed bottom protrusion portion 9 were 160 µm×760 µm (FIG. 4E).

Comparative Example 1

Figure 5A:
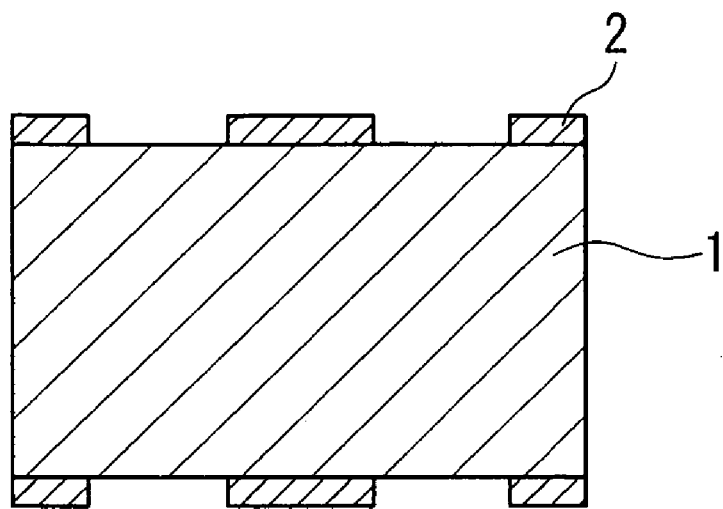
FIG. 5A is a schematic cross-sectional view showing a metal substrate having a resist layer formed into a pattern.
Figure 5B:
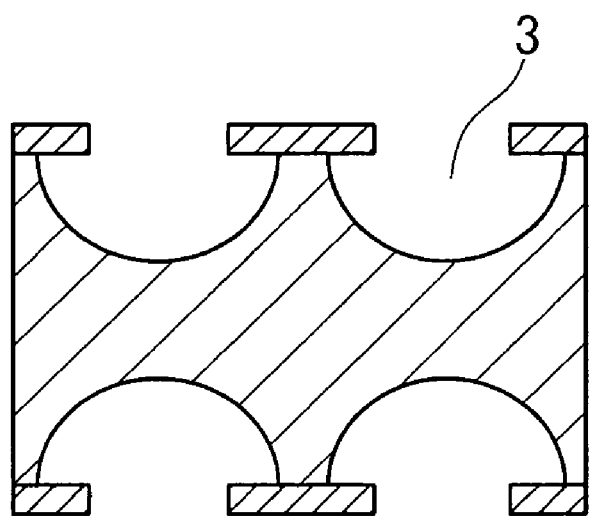
FIG. 5B is a schematic cross-sectional view showing a metal substrate on which primary etching has been carried out.
Figure 5C:
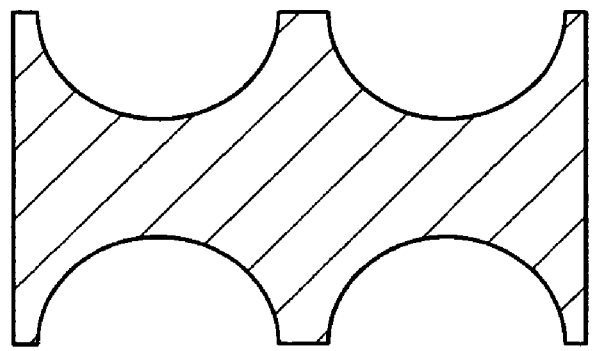
FIG. 5C is a schematic cross-sectional view showing the resulting product of the prior art.

FIGS. 5A to 5C are schematic explanatory cross-sectional views showing the steps of a production method of Comparative Example 1. An iron-based metal material substrate 1 having a thickness of 500 µm was alkaline-degreased and coated on both sides thereof with a positive photoresist (PMER P-RH300PM, Tokyo Ohka Kogyo Co., Ltd.) to a film thickness of 10 µm. Next, the substrate was exposed to ultraviolet light through a first photomask having a slot pattern, which has holes of 260 µm×860 µm and a pitch of 350 µm×1000 µm, and by spray-developing with an aqueous alkaline solution, the pattern of positive photoresist 2 was formed to the same dimensions as the photomask (FIG. 5A).

The primary etching step was conducted such that a ferric chloride etching solution was sprayed at 50° C. and 0.3 MPa (FIG. 5B). After washing with water, the substrate was immersed in a 3% by weight aqueous solution of sodium hydroxide at 60° C. to remove the positive photoresist pattern, and a half-etched cavity 3 having a semi-elliptical cross-section, in which dimensions of the opening in a surface of the metal having a plate thickness of 500 µm were 300 µm×900 µm, was produced (FIG. 5C).

Thus, a complex, three-dimensional shape is unable to be formed using a production method of the prior art.

Example 2

Figure 6A:
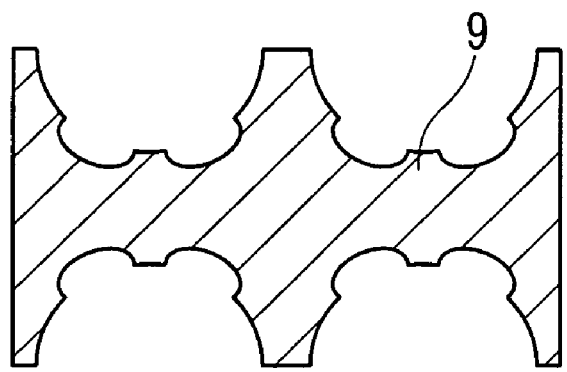
FIG. 6A is a schematic cross-sectional view that is the same as FIG. 4E.
Figure 6B:
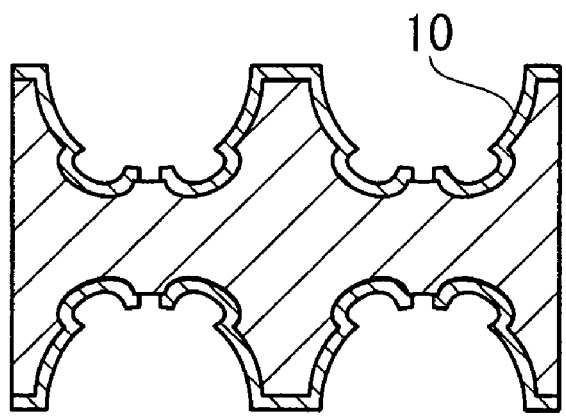
FIG. 6B is a schematic cross-sectional view showing a metal substrate on which an electrodeposited resist layer has been formed.

FIGS. 6A to 6D are schematic explanatory cross-sectional views showing the steps of a production method of the present Example 2. A coating of a positive electrodeposition photoresist (Sonne EDUV P-500, Kansai Paint Co., Ltd.) was provided at a film thickness of 2 µm onto the three-dimensional shape having a processed bottom protrusion portion 9 formed in Example 1 (FIG. 6A). Next, the substrate was exposed at 150 mJ/cm$^2$ through a third photomask having a slot pattern, which has holes of 100 µm×700 µm and a pitch of 350 µm×1000 µm and is aligned so that the holed slot pattern was arranged in the center of processed bottom protrusion portion 9. Furthermore, heat treatment was conducted thereto for 15 minutes at 140° C., and spray-developing was conducted by using a 1% by weight aqueous solution of sodium carbonate at 35° C. (FIG. 6B).

Figure 6C:
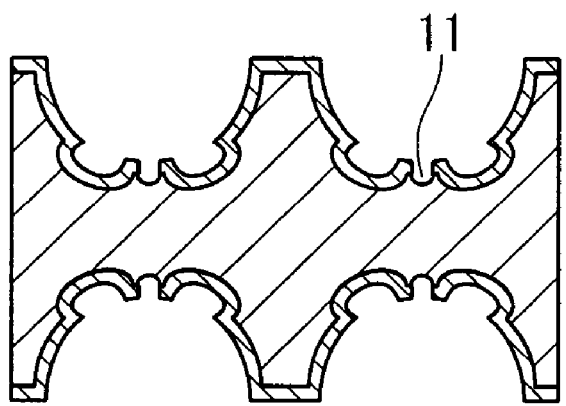
FIG. 6C is a schematic cross-sectional view showing that a selected portion of an electrodeposited resist layer has been exposed and developed.
Figure 6D:
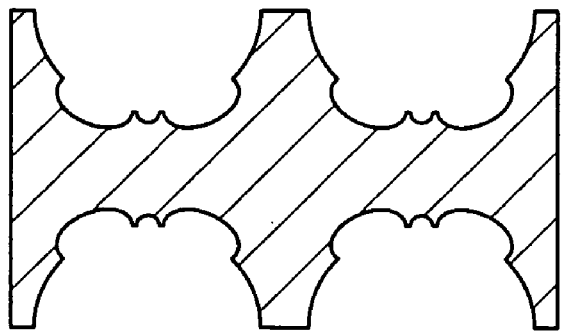
FIG. 6D is a schematic cross-sectional view showing the shape of the resulting product of the present invention.

Moreover, a third etching step was conducted such that a ferric chloride etching solution was sprayed at 50° C. and 0.3 MPa (FIG. 6C). Subsequently, the resist was removed to produce a three-dimensional shape in which the dimensions of the opening on a surface of the metal having a plate thickness of 500 µm is 300 µm×900 µm, the dimensions of the processed bottom protrusion portion 9 were 160 µm×760 µm, and the dimensions of the tertiary etched portion 11 formed on the processed bottom protrusion portion, which were measured at the surface of the processed bottom protrusion portion, were 130 µm×730 µm (FIG. 6D).

Example 3

Figure 7A:
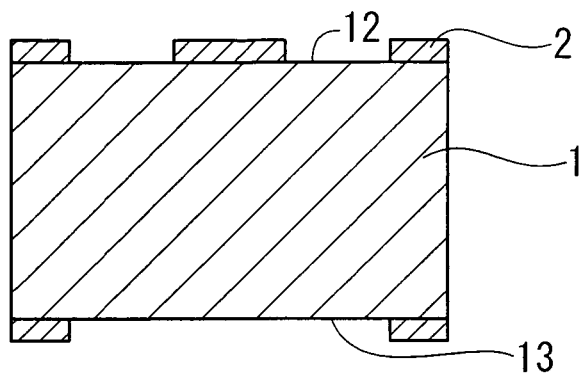
FIG. 7A is a schematic cross-sectional view showing a metal substrate having a resist layer formed into a pattern on the top and bottom thereof.
Figure 7B:
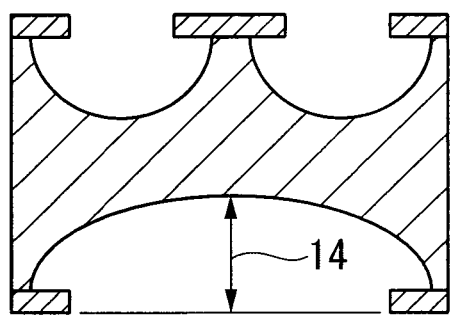
FIG. 7B is a schematic cross-sectional view showing a metal substrate on which primary etching has been carried out.

FIGS. 7A to 7E are schematic explanatory cross-sectional views showing the steps of a production method of the present Example 3. An iron-based metal material substrate 1 having a thickness of 500 µm was alkaline-degreased and coated with a positive photoresist (PMER P-RH300PM, Tokyo Ohka Kogyo Co., Ltd.) to a film thickness of 10 µm. Next, a metal surface 12, which is a side A of the substrate, was exposed to ultraviolet light through a photomask A, in which a slot pattern having holes of 260 µm×860 µm and a pitch of 350 µm×1000 µm was formed, and a metal surface 13, which is a side B of the substrate, was exposed to ultraviolet light through a first photomask B, in which a slot pattern having holes of 610 µm×860 µm and a pitch of 700 µm×1000 µm. Next, by spray-developing with an aqueous alkaline solution, the pattern of positive photoresist 2 was formed at the same dimensions as the first photomasks (FIG. 7A)

The primary etching step was conducted such that a ferric chloride etching solution was sprayed at 50° C. and 0.3 MPa until the side etching progressed to 20 µm (FIG. 7B) and after washing with water, the substrate was immersed in a 3% by weight aqueous solution of sodium hydroxide at 60° C. to remove the positive photoresist. Depth 14 from the metal surface at that time was 50 µm.

Figure 7C:
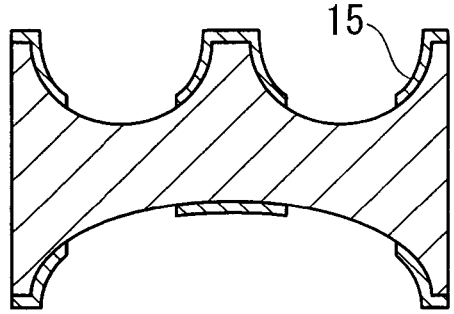
FIG. 7C is a schematic cross-sectional view showing that an electrodeposited resist layer formed on the substrate has been exposed and developed.

Next, coating of positive electrodeposition photoresist 15 (Sonne EDUV P-500, Kansai Paint Co., Ltd.) was provided thereon at a film thickness of 8 µm. Next, exposure was carried out at 150 mJ/cm$^2$ through second photomask, which has a slot pattern having holes of 260 µm×860 µm and a pitch of 350 µm×1000 µm, in both metal surfaces 12 and 13 followed by heat treating at 140° C. for 15 minutes and spray-developing with a 1% by weight aqueous solution of sodium carbonate at 35° C. (FIG. 7C).

Figure 7D:
FIG. 7D is a schematic cross-sectional view showing that second etching has been carried out.
Figure 7E:
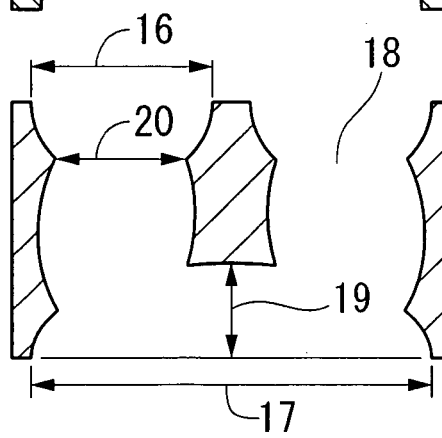
FIG. 7E is a schematic cross-sectional view showing the shape of the resulting product of the present invention.

Moreover, the second etching step was conducted such that a ferric chloride etching solution was sprayed at 50° C. and 0.3 MPa (FIG. 7D). The resist was removed to produce a three-dimensional shape in which dimensions of opening 16 in metal surface A of the metal which has a plate thickness of 500 µm were 300 µm×900 µm, the dimensions of opening 17 in metal surface B were 650 µm×900 µm, depth 19 of the processed bottom protrusion from metal surface B was 50 µm, and the dimensions of penetrating portion 20 were 280 µm×880 µm (FIG. 7E).

Comparative Example 2

Comparative Example 2 indicates etching from both sides of a metal substrate according to single-step etching of the prior art. As can be understood from a comparison with the examples, it is necessary to at least half the plate thickness in order to carry out etching at an equal pitch.

Figure 10A:
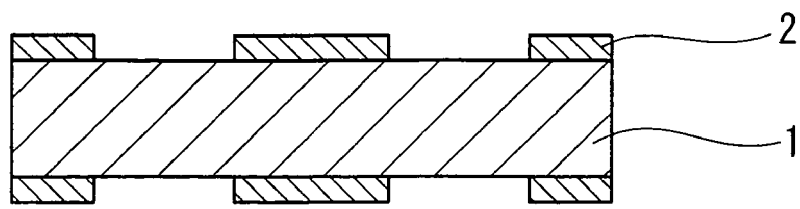
FIG. 10A is a schematic cross-sectional view of the prior art showing a metal substrate having a patterned positive photoresist layer.
Figure 10B:
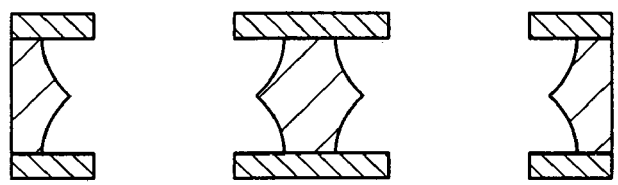
FIG. 10B is a schematic cross-sectional view showing the cross-sectional shape in a primary etching step.
Figure 10C:
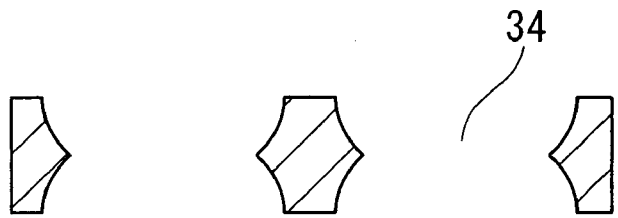
FIG. 10C is a schematic cross-sectional view showing a product following removal of a photoresist.

FIGS. 10A to 10C are schematic explanatory cross-sectional views showing the steps of a production method of Comparative Example 2. An iron-based metal material substrate 1 having a thickness of 200 µm was alkaline-degreased and coated on both sides with a positive photoresist (PMER P-RH300PM, Tokyo Ohka Kogyo Co., Ltd.) to a film thickness of 10 µm. Next, the substrate was exposed to ultraviolet light through a photomask in which a slot pattern has holes of 260 µm×860 µm and a pitch of 350 µm×1000 µm, and by spray-developing with an aqueous alkaline solution, the pattern of positive photoresist 2 was formed to the same dimensions as the photomask (FIG. 10A).

The primary etching step was conducted such that a ferric chloride etching solution was sprayed at 50° C. and 0.3 MPa until SE progressed to 20 µm (FIG. 10B). After washing with water, the substrate was immersed in a 3% by weight aqueous solution of sodium hydroxide at 60° C. to remove the positive photoresist pattern and produce a through hole 34 of 300 µm×900 µm of a slot pattern, wherein a plate thickness is 200 µm and an EF (one side) is 2.6 (FIG. 10C). A production method of the prior art only allows the obtaining of a product having a thin plate thickness in this manner.

Example 4

FIGS. 1A to 1E are schematic explanatory cross-sectional views showing the steps of a production method of the present Example 4. An iron-based metal material substrate 1 having a thickness of 500 μm was alkaline-degreased and both sides of the substrate were coated with a positive photoresist (PMER P-RH300PM, Tokyo Ohka Kogyo Co., Ltd.) to a film thickness of 10 μm. Next, the top was exposed to ultraviolet light through a first photomask in which a slot pattern having holes of 710 μm×170 μm and a pitch of 800 μm×260 μm. In addition, the bottom was exposed to ultraviolet light through a second photomask in which a slot pattern having holes of 170 μm×170 μm and a pitch of 400 μm×260 μm. Next, by spray-developing with an aqueous alkaline solution, the pattern of positive photoresist 2 for a primary etching step was formed on the top at the same dimensions as the first photomask, while the pattern of positive photoresist 2 for a primary etching step was formed on the bottom at the same dimensions as the second photomask (FIG. 1A).

The primary etching step was conducted such that a ferric chloride etching solution was sprayed at 50° C. and 0.3 MPa until the side etching progressed to 20 μm to form a half-etched portion 3 following primary etching (FIG. 1B). Here, the half-etched portion on the top had a larger diameter and depth than the half-etched portion on the bottom. After washing with water, the substrate was immersed in a 3% by weight aqueous solution of sodium hydroxide at 60° C. to remove the positive photoresist.

Next, coating of positive electrodeposition photoresist 4 (Sonne EDUV P-500, Kansai Paint Co., Ltd.) was provided at a film thickness of 8 μm. Next, the top and bottom were exposed through a third photomask, which has a slot pattern having holes of 740 μm×200 μm and a pitch of 800 μm×260 μm, and also has a rectangular shade portion of 200 μm×200 μm within the slot pattern. Exposure was then carried out at 150 mJ/cm² followed by heat treating at 140° C. for 15 minutes and spray-developing with a 1% by weight aqueous solution of sodium carbonate at 35° C. (FIG. 1C).

Moreover, the second etching step was conducted such that a ferric chloride etching solution was sprayed at 50° C. and 0.3 MPa to obtain a penetrating hole 5 (see FIG. 1D). Subsequently, the resist was removed to produce a metal photoetching product 6 having a large cavity in which depth D1 was 250 μm and minor axis $W_1S$ and major axis $W_1L$ of the opening in the metal surface were 210 μm and 750 μm, and two cavities in which depth D2 was 250 μm and minor axis $W_2S$ and major axis $W_2L$ of the openings located in the large cavity surface were 210 μm and 270 μm (FIG. 1E).

Here, plate thickness D equal to D1+D2 of the metal photoetching product was 500 μm, and 0.4×D<$W_1S$<D was 120<210<300 μm, and 0.2×D<$W_2S$<0.8×D was 60<210<240 μm.

Example 5

FIGS. 2A to 2E are schematic explanatory cross-sectional views showing the steps of a production method of the present Example 5. An iron-based metal material substrate 1 having a thickness of 500 μm was alkaline-degreased, and both sides thereof were coated with a positive photoresist (PMER P-RH300PM, Tokyo Ohka Kogyo Co., Ltd.) to a film thickness of 10 μm. Next, the surface was exposed to ultraviolet light through a first photomask in which a slot pattern has holes of 1080 μm×400 μm (for a large cavity) and 200 μm×400 μm (for a small cavity) and a pitch of 1800 μm×560 μm. Next, by spray-developing with an aqueous alkaline solution, the pattern of positive photoresist 2 for a primary etching step was formed at the same dimensions as the first photomask (FIG. 2A).

The primary etching step was conducted such that a ferric chloride etching solution was sprayed at 50° C. and 0.3 MPa until the side etching progressed to 30 μm, and half-etched portion 3 was formed following the primary etching (FIG. 2B). Subsequently, after washing with water, the substrate was immersed in a 3% by weight aqueous solution of sodium hydroxide at 60° C. to remove the positive photoresist.

Next, coating of positive electrodeposition photoresist 4 (Sonne EDUV P-500, Kansai Paint Co., Ltd.) was provided thereon at a film thickness of 8 μm. Next, exposure was carried out through a second photomask which has a slot pattern having holes of 250 μm×450 μm and a pitch of 1800 μm×560 μm and also has a shade portion. Exposure was carried out at 150 mJ/cm², and after heat treating at 140° C. for 15 minutes, the substrate was spray-developed with a 1% by weight aqueous solution of sodium hydroxide at 35° C. to form an opening 7 in the resist within the small cavity (FIG. 2C).

Moreover, the second etching step was conducted such that a ferric chloride etching solution was sprayed at 50° C. and 0.3 MPa to obtain etched portion 8 (see FIG. 2D). Subsequently, the resist was removed to produce a metal photoetching product 9 having a large cavity in which depth D1 was 300 μm and minor axis $W_1S$ and major axis $W_1L$ of the opening located in the metal surface were 460 μm and 1140 μm, and a small cavity in which depth D2 was 240 μm and minor axis $W_2S$ and major axis $W_2L$ of the opening located in the metal surface were 260 μm and 460 μm (FIG. 2E).

Furthermore, D of the metal photoetching product was 500 μm, 0.5×$W_1S$<D1<D was 260<300<500 μm, 0.5×$W_2S$<D2<D was 130<240<500 μm, 1.7×$W_2S$<$W_1S$<5×$W_2S$ was 442<460<1300 μm, and 0.5×D2<D1<1.5×D2 was 120<300<360 μm.

Example 6

FIGS. 3A to 3E are schematic explanatory cross-sectional views showing the steps of a production method of the present Example 6. An iron-based metal material substrate 1 having a thickness of 500 μm was alkaline-degreased and both sides thereof were coated with a positive photoresist (PMER P-RH300PM, Tokyo Ohka Kogyo Co., Ltd.) to a film thickness of 10 μm. Next, the surface was exposed to ultraviolet light through a first photomask which has a slot pattern having holes of 510 μm×180 μm (for a large cavity) and a slot pattern having holes of 80 μm×180 μm (for a small cavity) at a pitch of 770 μm×270 μm. Next, by spray-developing with an aqueous alkaline solution, the pattern of positive photoresist 2 for a primary etching step was formed at the same dimensions as the first photomask (FIG. 3A).

The primary etching step was conducted such that a ferric chloride etching solution was sprayed at 50° C. and 0.3 MPa until the side etching progressed to 20 μm, and half-etched portion 3 was formed following the primary etching (FIG. 3B). Subsequently, after washing with water, the substrate was immersed in a 3% by weight aqueous solution of sodium hydroxide at 60° C. to remove the positive photoresist.

Next, coating of positive electrodeposition photoresist 4 (Sonne EDUV P-500, Kansai Paint Co., Ltd.) was provided thereto at a film thickness of 8 μm. Next, exposure was carried out through a second photomask which has a slot pattern of 110 μm×210 μm and a pitch of 770 μm×270 μm and also has shade portion. Exposure was carried out at 150 mJ/cm², and after heat treating at 140° C. for 15 minutes, the substrate was spray-developed with a 1% by weight aqueous solution of sodium hydroxide at 35° C. to form an opening 7 in the resist within the large cavity (FIG. 3C).

Moreover, the second etching step was conducted such that a ferric chloride etching solution was sprayed at 50° C. and 0.3 MPa to obtain etched portion 8 (see FIG. 3D). Subsequently, the resist was removed to produce a metal photoetching product 9 having a large cavity in which depth D1 was 170 μm and minor axis $W_1S$ and major axis $W_1L$ of the opening in the metal surface were 220 μm and 550 μm, and a small cavity in which depth D2 was 110 μm and minor axis $W_2S$ and major axis $W_2L$ of the opening in the metal surface were 120 μm and 220 μm (FIG. 3E).

Here, D of the metal photoetching product was 500 μm, $0.5 \times W_1S < D1 < D$ was $110 < 170 < 300$ μm, $0.5 \times W_2S < D2 \leq D$ was $60 < 110 < 300$ μm, $W_2S < W_1S < 2.0 \times W_2S$ was $120 < 220 < 240$ μm, and $0.2 \times D1 < W_2S < 0.8 \times D1$ was $34 < 120 < 136$ μm.

INDUSTRIAL APPLICABILITY

According to the present invention, a dramatically high etching factor is obtained with high accuracy and in accordance with a design. The effect is possible by carrying out anisotropic etching in which etching can selectively proceed in the direction of depth (direction toward to the deep portion of a layer), namely by carrying out multi-step etching which includes repeated steps of coating of an electrodeposition photoresist, while preventing progression of side etching. As a result, deep etching can be carried out in thick metal materials, and a metal etching product can be provided having a metal pattern having a heretofore impossible high aspect ratio and fine-pitch etched shape, and a high aspect ratio and high-definition heteromorphic cross-sectional shape.

The invention claimed is:

1. A metal photoetching product comprising:
at least one large cavity of minor axis $W_1S$, major axis $W_1L$ and depth D1 in a surface of the product, wherein
at least two cavities are included inside at least one of the at least one large cavity, and
a smallest hole among the cavities has minor axis of $W_2S$, major axis $W_2L$, and depth D2; and $D1+D2$=plate thickness $D$, 0.02 mm$\leq D \leq$2 mm, $0.4 \times D < W_1S < D$, and $0.2 \times D < W_2S < 0.8 \times D$; and at least one combination of the large cavity and the smallest hole formed in the large cavity has an etching factor of 2.6 or more, where the etching factor is EF=ED/SE wherein EF represents the etching factor, ED represents an etched depth of a cavity to be evaluated, SE represents a primary side etching which is a half of a difference between a dimension of an opening of the cavity formed by primary etching and a dimension of an opening of a photoresist pattern used for the primary etching, and when there are two primary side etchings as a result of photoetching conducted from both upper and lower surfaces of a metal substrate, SE represents the larger one.

2. A metal photoetching product comprising:
at least one combination of a large cavity of minor axis $W_1S$, major axis $W_1L$ and depth D1, and a small cavity of minor axis $W_2S$, major axis $W_2L$ and depth D2 in a surface of the metal photoetching product with a plate thickness D under the surface, wherein 0.02 mm$\leq D \leq$2 mm, $0.5 \times W_1S < D1 < D$, $0.5 \times W_2S < D2 < D$, $1.7 \times W_2S < W_1S < 5 \times W_2S$, and $0.5 \times D2 < D1 < 1.5 \times D2$, and at least one of the large cavity and the small cavity has an etching factor of 2.6 or more, where the etching factor is EF=ED/SE wherein EF represents the etching factor, ED represents an etched depth of a cavity to be evaluated, SE represents a primary side etching which is a half of a difference between a dimension of an opening of the cavity formed by primary etching and a dimension of an opening of a photoresist pattern used for the primary etching, and when there are two primary side etchings as a result of photoetching conducted from both upper and lower surfaces of a metal substrate, SE represents the larger one, wherein the at least one of the large cavity and the small cavity include two or more cavities therein.

3. A metal photoetching product, comprising:
at least one combination of a large cavity of minor axis $W_1S$, major axis $W_1L$ and depth D1, and a small cavity of minor axis $W_2S$, major axis $W_2L$ and depth D2 in a surface of the metal photoetching product with a plate thickness D under the surface, wherein 0.02 mm$\leq D \leq$2 mm, $0.5 \times W_1S < D1 \leq D$, $0.5 \times W_2S < D2 \leq D$, $W_2S < W_1S < 2.0 \times W_2S$, and $0.2 \times D1 < W_2S < 0.8 \times D1$, and at least one of the large cavity and the small cavity has an etching factor of 2.6 or more, where the etching factor is EF=ED/SE wherein EF represents the etching factor, ED represents an etched depth of a cavity to be evaluated, SE represents a primary side etching which is a half of a difference between a dimension of an opening of the cavity formed by primary etching and a dimension of an opening of a photoresist pattern used for the primary etching, and when there are two primary side etchings as a result of photoetching conducted from both upper and lower surfaces of a metal substrate, SE represents the larger one, wherein the at least one of the large cavity and the small cavity include two or more cavities therein.

* * * * *